United States Patent [19]

McCaughey, Jr.

[11] Patent Number: 5,259,311
[45] Date of Patent: Nov. 9, 1993

[54] LASER ENGRAVING OF PHOTOPOLYMER PRINTING PLATES

[75] Inventor: Donald G. McCaughey, Jr., Fallston, Md.

[73] Assignee: Mark/Trece Inc., Fallston, Md.

[21] Appl. No.: 913,381

[22] Filed: Jul. 15, 1992

[51] Int. Cl.$^5$ .................. B41N 3/03; G03F 7/36
[52] U.S. Cl. .................. 101/401.1; 430/256; 430/306; 430/327; 430/945
[58] Field of Search .............. 101/395, 401.1; 430/306, 307, 309, 327, 328, 256, 258, 945

[56] References Cited

U.S. PATENT DOCUMENTS

| | | | |
|---|---|---|---|
| 3,506,779 | 4/1970 | Brown et al. | 101/401.1 |
| 4,384,011 | 5/1983 | Aoyama et al. | 430/306 |
| 4,388,865 | 6/1983 | Kellner | 101/401.1 |
| 4,877,644 | 10/1989 | Wu et al. | 430/945 |

FOREIGN PATENT DOCUMENTS 315152  5/1989  European Pat. Off. ............ 430/945

*Primary Examiner*—Edgar S. Burr
*Assistant Examiner*—Stephen R. Funk
*Attorney, Agent, or Firm*—Morton J. Rosenberg; David I. Klein

[57] ABSTRACT

A method for laser engraving photopolymer printing plates is provided. Prior to the laser engraving step (30), the photopolymer material is totally cured, followed by removal of a release layer disposed on the material. The laser engraving step (30) which follows removal of the release layer produces a plurality of tacky particulates (120) which adhere to the surface layer of the photopolymer material (100) adjacent the ablated regions (110). The particulates (120) are removed in a solvent washing step (40) to provide clean sharp edges (115) adjacent the ablated regions (110). Subsequent to removal of the photopolymer residue (120) the engraved printing plate is finished, by either chemical or light finishing methods.

18 Claims, 1 Drawing Sheet

LASER ENGRAVING OF PHOTOPOLYMER PRINTING PLATES

BACKGROUND OF THE INVENTION

1. Field of the Invention

This invention directs itself to a method for laser engraving of photopolymer printing plates. In particular, this invention directs itself to a method for laser engraving photopolymers normally utilized in a chemical etch process, which are then prepared by the inventive method for laser ablation. Further, this invention directs itself to a method for laser engraving which includes steps for removing polymer particulates, previously molten by the base ablation and which have become attached to the upper surface of the engraved photopolymer printing plate, prior to the final finishing thereof.

2. Prior Art

Methods of laser engraving are well known in the art. The best prior art known to the Applicant include U.S. Pat. Nos. 5,075,365; 3,549,7913; 4,898,752; 4,877,481; 4,909,895; 5,011,567; 4,323,928; 4,934,267; 4,894,115; 4,897,153; 4,925,523; 3,755,646; 4,379,022; 4,661,201; and, 3,742,853.

In some prior art systems, such as that disclosed by U.S. Pat. Nos. 3,549,733 and 4,898,752 there is disclosed methods for laser engraving printing plates and the problems associated therewith. These disclosures note the problems associated with laser engraving flexographic type plates, that is the production of residue or a ridge surrounding the depressed areas when soft polymer materials are utilized. In particular, it is noted in U.S. Pat. No. 4,898,752 that laser engraving of photopolymer plates result in mottled printed surfaces, and therefore the disclosed method utilizes a rubber material having a Shore A hardness of 55 or less. U.S. Pat. No. 3,549,733 suggests two possible solutions to the problem, the least practical being the use of a laser beam of sufficient intensity so as to vaporize the material without producing any melting, but then goes on to say that this method would be virtually impossible. The preferred solution, suggested by this reference is the use of a particular material, an acetal resin such as DELRIN which could be engraved without forming any ridge around the depressed areas. However, neither of these disclosures suggest methods by which the photopolymer material, widely used to produce flexographic printing plates, and the associated photopolymer processing equipment, could be utilized in a laser engraving process. Flexographic printing plate manufacturers have a large investment in materials and equipment for chemical etch processing of photopolymer plates, which can be utilized to produce laser engraved flexographic printing plates by the method of the instant invention.

In other systems, such as that disclosed by U.S. Pat. Nos. 4,877,481 and 4,909,895 there is disclosed methods for removing residue or ridges adjacent laser engraved surfaces. Although these disclosures are not directed to laser engraving of flexographic printing plates, they note the formation of a residue resulting from laser ablation. The disclosed processes solve the problem by adding a coating layer to the surface of the material to be laser engraved, and then remove the coating layer subsequent to laser engraving, to thereby remove the residue therewith. Whereas in the method of the instant invention a process for removing the residue without the addition of additional coatings is provided, thereby providing a more efficient process. The novel method of the instant invention providing an economical method for providing high quality laser engraved photopolymer printing plates.

SUMMARY OF THE INVENTION

A method for laser engraving of photopolymer printing plates is provided. First, the photopolymer printing plate material is cured to provide at least an entire upper surface layer of photopolymer cured to a predetermined depth. The upper surface of the photopolymer material is then laser engraved in a particular pattern. Subsequent to laser engraving, photopolymer residue is removed from the upper surface of the engraved photopolymer printing plate.

It is an object of the invention to provide a method of producing flexographic printing plates from photopolymer materials without the use of graphic art film or photographic masks.

It is another object of the invention to provide a method for producing high quality photopolymer flexographic printing plates using laser engraving.

It is yet another object of the invention to provide a method of laser engraving photopolymer printing plates utilizing conventional photopolymer processing equipment in combination with a laser engraver.

DESCRIPTION OF THE PREFERRED EMBODIMENTS

Figure 1:
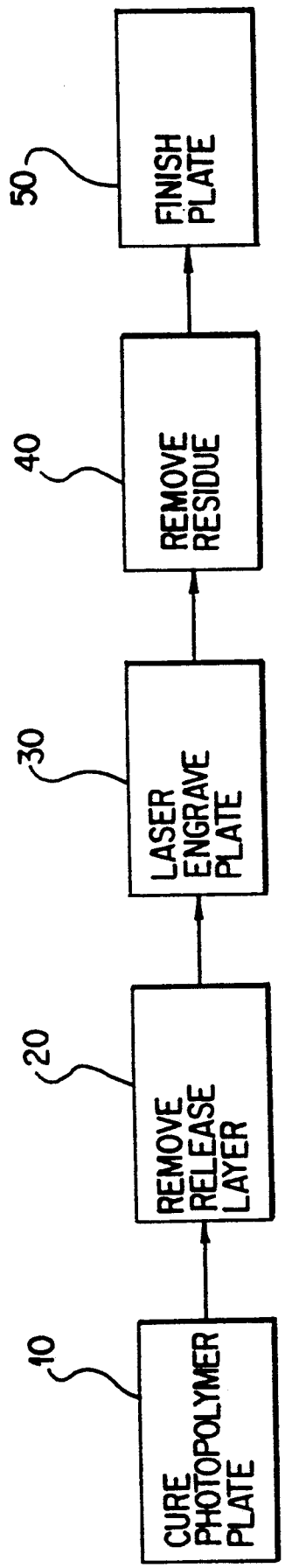
FIG. 1 is a block diagram of the method for laser engraving photopolymer printing plates.

Referring now to FIG. 1, there is shown, a block diagram representing the method steps for laser engraving of a photopolymer printing plate. As will be seen in following paragraphs, the novel method provides high quality flexographic printing plates utilizing laser engraving of conventional photopolymer materials, which heretofore had not been laser engraveable by conventional methods. Although not restricted to commercial flexographic printing, the novel method described herein is particularly adapted for use in providing highly detailed flexographic printing plates of relatively soft durometer.

As in conventional preparation of photopolymer flexographic printing plates, the sheet photopolymer material is cut to size prior to preparation for engraving. In a liquid photopolymer system, the photopolymer material is molded into a sheet of appropriate size, trimmed if necessary, and then processed in substantially the same manner as the sheet material. In the first step 10, the photopolymer plate is cured in a manner which is unique to the instant method, as compared to conventional chemical etch methods. As in conventional chemical etching of photopolymer printing plates, the entire back surface of the printing plate is exposed to ultraviolet light for a predetermined period, the length of time of exposure, and the intensity thereof determining the depth of cure obtained through the back surface, In a chemical etch process the front surface of the photopolymer printing plate is exposed to ultraviolet light through a photographically prepared negative, acting as a mask, to cure only those portions of the plate surface which are not to be removed by the chemical etch solution. Whereas in the instant method the entire upper surface of the photopolymer printing plate is exposed to ultraviolet light for a predetermined period in order to provide the entire surface with a cured layer of material, thereby eliminating the process steps and expense of preparing the graphic art negative and applying it to the photopolymer material to provide a photographic mask. It is desirable to cure the photopolymer material throughout its thickness. To insure a complete cure, the photopolymer material is exposed from both sides in a two step procedure, since existing photopolymer processing equipment is designed for single sided exposure. Obviously, other equipment could be utilized to simultaneously expose both front and back surfaces of the photopolymer plate without departing from the inventive concept. Alternately, the photopolymer plate could be exposed on a single side, but for a longer period of time, to provide a full cute. This method avoids the criticality of the conventional method, wherein the photopolymer must be cured to a particular depth and any over, or under cure has deleterious effects on the finished printing plate.

Subsequent to the curing method step 10, the release layer supplied with the photopolymer material may be removed in step 20. The release layer is a coating supplied on the photopolymer material to improve the contiguous contact between the photographic mask and the upper surface of the photopolymer, which is unnecessary in a laser engraving process.

The laser engraving step can be carried out through the release layer, the release layer could then be removed in step 40, simultaneously with the photopolymer residue. Step 20 includes the step of washing the printing plate in a solvent solution, the plate being immersed in the solvent for a predetermined time period, and at a predetermined temperature. Following the solvent step, the plate is then dried, exposed to a predetermined temperature for a predetermined length of time. The time and temperature is controlled to provide proper drying, driving off the solvent which has been absorbed by the plate, and thereby prevent solvent swelling which would otherwise make the plates uneven in gauge.

In step 30, the dried plates are laser engraved. The laser engraver control unit can be supplied input data through artwork which is scanned as the photopolymer plate is engraved, or alternately, supplied with a digitized representation of the engraving directly from a separate computer system wherein the artwork is provided utilizing computer aided design (CAD) software, digitization of photographic or drafted artwork, or a combination thereof. While the use of a laser to engrave the photopolymer printing plate permits fine line, intricate patterns to be formed, the laser energy causes the production of a particulate residue surrounding the depressed areas formed by the laser beam. This residue formation on the plate would produce a mottled printed surface if otherwise not removed. However, the transition through a molten state has made the particulates extremely tacky, adhering to both the plate and themselves.

The residue produced by the laser ablation step 30 is removed in step 40 by immersing the engraved photopolymer printing plate in a solvent solution for a predetermined time period and at a predetermined temperature. The residue particulates which form on the plate, and particularly on the edges surrounding the laser ablated areas, are readily removed in a solvent wash step. This step is accomplished without causing removal of the photopolymer material which defines the printable pattern, since the engraving is performed on fully cured material and not soluble in the solution. The engraved plate is immersed in the solvent solution for a predetermined time and at a predetermined temperature to remove the tackiness from the residue and thereby provide sharp edges at the perimeter of the ablated areas, as the particulates are easily removed by brushing when they are no longer self adhering. Following the washout step to remove the residue, the engraved plate is dried at a predetermined temperature for a time period sufficient to drive off any absorbed solvent, as was previously done in the release layer removal step 20.

Following the removal of the uncured residue the engraved plate then goes through the finishing step 50. In step 50 surface tack is removed from the engraved plate and the surface is hardened. There are typically two ways in which such surface tack can be removed and the surface hardened. One method is exposure of the front surface of the engraved printing plate to high energy ultraviolet light for a predetermined period of time. The other method is a chemical finishing method wherein the engraved plate is immersed in a halogen solution, a solution containing chlorine, bromine or iodine. The finished plate is then ready for mounting on a printing press.

As described above, the novel method for laser engraving photopolymer printing plates permits the plate manufacturer to utilize standard materials. The materials which are used in chemical etch processing and with which the manufacturer is familiar being adaptable to laser engraving by the instant method. A major advantage being that the equipment utilized for processing the photopolymer material remains unchanged, that is the ultraviolet light exposure equipment formerly utilized to define the printing pattern on the plate can be utilized for preparation step 10 wherein the photopolymer plate is cured. One such exposure unit being provided by the E.I. Dupont Company for use with their CYREL® plate making system, and having the designation 2001, has been successfully utilized. Exposure units of this type typically utilize forty 100 watt ultraviolet light tubular lamps to expose the photopolymer material. The back surface of the photopolymer printing plate is exposed to the ultraviolet light from this source for a time period having an approximating range of one to six minutes. Subsequent to the back exposure, the entire front surface of the photopolymer is exposed to the ultraviolet light from this source for a period having an approximating range of one to six minutes to provide the desired depth of cure. Overcuring is not a problem for this method, unlike the chemical etch method where overcuring is detrimental to the process and results in defective plates.

To remove the release layer in step 20, the exposed photopolymer plate is washed utilizing a computer controlled processor conventionally used for etching of photopolymer printing plates. In conventional plate processing the release layer is required to insure good contact between the photographic mask and the plate, and is removed simultaneously with the etching of the unexposed portions of the photopolymer plate. Since the instant method provides for exposure of the entire surface of the printing plate, both front and rear, only the release layer is removed during the washing step. Although not important to the inventive concept, the solvent solution utilized for the particular photopolymer material used is a solution of heptyl acetate and isoheptyl alcohol, which is the conventional solvent utilized for etching uncured portions of photopolymer printing plates utilizing conventional processing equipment. The solvent is maintained at approximately 40.0 degrees Centigrade, with the plate remaining immersed for a time period in the approximating range of 15 to 20 minutes while being brushed by the rotating brushes of the solvent processor. Subsequently, the plate is dried at a temperature approximating 60.0 degrees Centigrade, the drying step being carried out for a time period within the approximating range of 10 to 15 minutes.

The prepared plate, having completed steps 10 and 20 is next laser engraved. The laser engraver is the only new piece of equipment required to convert conventional photopolymer printing plate preparation to a laser engraving process. One laser engraving device which has been successfully utilized in the instant method is a 1200 watt, carbon dioxide laser engraver available from Zed Instruments Limited of Hersham, England. Such laser engraving equipment has heretofore been utilized for engraving materials of harder durometer and which remain tack-free subsequent to such engraving.

Figure 3:
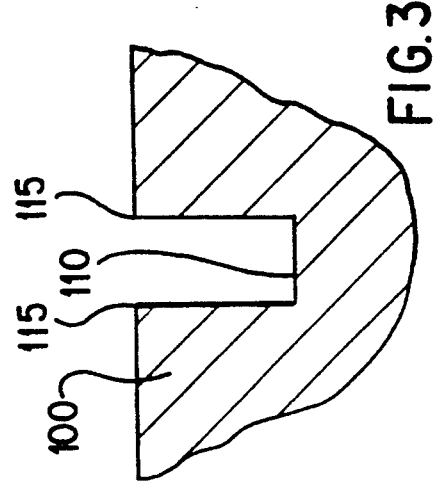
Figure 2:
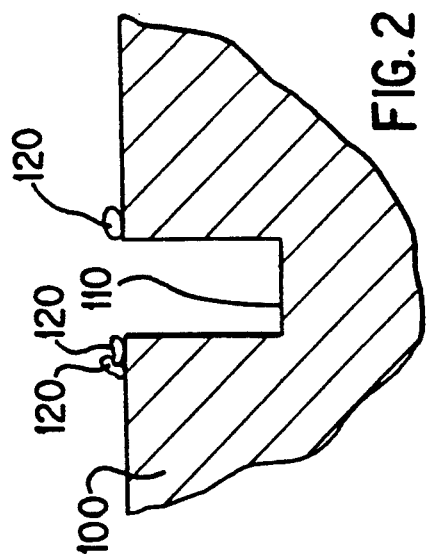
FIG. 2 is a cross-sectional view of a portion of the photopolymer material showing residue particulates which form subsequent to laser engraving; and, FIG. 3 is a cross-sectional view of a portion of the photopolymer material shown subsequent to removal of the residue particulates.

The laser ablation step produces fine particulates of cured photopolymer which had been molten and attach themselves to the upper surface of the engraved photopolymer material, and particularly along the edges of the ablated regions. The tackiness of the once molten photopolymer particles provides sufficient adhesion between the particulates and the upper surface of the plate so as to require additional processing, as is provided in step 40. As shown in FIG. 2, this residue 120 is typically deposited close to the ablated region 110 of the photopolymer material 100. Such residue 120 is removed in a washing step utilizing the same processor as has previously been described for removing the release layer in step 20, wherein rotating brushes contact the plate in the presence of a solvent. Here again, the solvent is maintained at a temperature approximating 40 degrees Centigrade and the washing step carried out for a time period within the approximating range of 15 to 20 minutes. As shown in FIG. 3, the photopolymer material 100 has sharp, well-defined edges 115 surrounding the ablated region 110 subsequent to washing step 40. Following the washing step the engraved plate is dried at a temperature approximating 60.0 degrees Centigrade for a time period in the approximating range of 10 to 15 minutes.

Subsequent to removal of the residue, the engraved plate is ready for the finishing step 50. The engraved photopolymer printing plate is exposed to high energy ultraviolet light in a conventional post-exposure light finisher, utilized for conventional finishing of chemically etched photopolymer printing plates. Such light finishers utilize a germicidal lamp, such as that supplied by the Kelleigh Corporation of Avenel, N.J., having the Manufacturer's Designation #249-111A. Such exposure to the germicidal lamp removes any residual tackiness and hardens the exposed surface, making it resistant to alcohol based solvents. It is believed that ozone generated by the germicidal lamp provides this chemical change in the exposed surface of the photopolymer material. Exposure in the light finishing system is maintained for a time period approximating 10 minutes.

Alternately, a chemical finishing treatment may be utilized to provide the removal of tackiness and hardening of the printing plate surface. Such treatment is generally carried out by briefly immersing the plate in a halogen solution containing chlorine, bromine or iodine solutions. However, light finishing is considered to be superior to chemical finishing in that more uniform and more predictable results are provided by light finishing. Subsequent to finishing, the engraved photopolymer printing plate is ready for mounting in a flexographic printing press.

Although this inventive process has been described in connection with specific forms and embodiments thereof, it will be appreciated that various modifications other than those discussed above may be resorted to without departing from the spirit or scope of the invention. For example, equivalent process steps may be substituted for those specifically shown and described, certain combinations of method steps may be used independently of other method steps, and in certain cases, particular sequences of steps may be reversed or interposed, all without departing from the spirit or scope of the invention as defined in the appended claims.

What is claimed is:

1. A method for laser engraving of a photopolymer printing plate, comprising the steps of:
   a. exposing an entire rear surface of said printing plate to ultraviolet light for curing a backing layer thereof;
   b. exposing an entire front surface of said printing plate to ultraviolet light for curing an upper layer thereof;
   c. removing a release layer from said photopolymer printing plate;
   d. laser engraving a particular pattern in said front surface of said photopolymer printing plate; and,
   e. removing surface tack and hardening said front surface of said photopolymer printing plate.

2. The method for laser engraving as recited in claim 1 where said step of removing surface tack is preceded by the step of washing said engraved printing plate to remove photopolymer residue from said front surface of said engraved photopolymer printing plate.

3. The method for laser engraving as recited in claim 2 where said step of washing said engraved printing plate includes the step of immersing and brushing said engraved printing plate in a solvent solution for a predetermined time period at a temperature approximating 40.0 degrees Centigrade.

4. The method for laser engraving as recited in claim 2 where said step of washing said engraved printing plate includes the step of drying said engraved printing plate.

5. The method for laser engraving as recited in claim 4 where said step of drying includes the step of exposing said engraved printing plate to a temperature approximating 60.0 degrees Centigrade for a predetermined time period.

6. The method for laser engraving as recited in claim 1 where said step of removing surface tack includes the step of exposing said front surface of said photopolymer printing plate to high energy ultraviolet light for a predetermined time period.

7. The method for laser engraving as recited in claim 1 where said step of removing surface tack includes the step of immersing said photopolymer printing plate in a halogen solution.

8. The method for laser engraving as recited in claim 1 where said step of exposing an entire rear surface of said printing plate includes the step of exposing said rear surface to ultraviolet light for a time period having an approximating range of 1.0 to 6.0 minutes.

9. The method for laser engraving as recited in claim 1 where said step of exposing an entire front surface of said printing plate includes the step of exposing said front surface to ultraviolet light for a time period having an approximating range of 1.0 to 6.0 minutes.

10. The method for laser engraving as recited in claim 1 where said step of removing said release layer includes the step of washing said photopolymer printing plate for a predetermined time period at a temperature approximating 40.0 degrees Centigrade.

11. The method for laser engraving as recited in claim 1 where said step of removing said release layer includes the step of drying said photopolymer printing plate.

12. The method for laser engraving as recited in claim 11 where said step of drying includes the step of exposing said engraved printing plate to a temperature approximating 60.0 degrees Centigrade for a predetermined time period.

13. A method for laser engraving of a photopolymer printing plate, comprising the steps of:

a. curing said photopolymer printing plate to provide at least an entire upper surface layer of photopolymer cured to a predetermined depth;
b. removing a release layer from said photopolymer printing plate;
c. laser engraving a particular pattern in said upper surface of said photopolymer printing plate; and,
d. removing photopolymer residue from said upper surface of said photopolymer printing plate.

14. The method for laser engraving as recited in claim 13 where said step of curing includes the step of exposing an entire front surface of said printing plate to ultraviolet light for curing said upper surface layer thereof.

15. The method for laser engraving as recited in claim 14 where said step of curing further includes the step of exposing an entire rear surface of said printing plate to ultraviolet light for curing a backing layer thereof.

16. The method for laser engraving as recited in claim 13 where said step of removing photopolymer residue is followed by the step of removing surface tack and hardening said upper surface of said engraved photopolymer printing plate.

17. The method for laser engraving as recited in claim 13 where said step of removing photopolymer residue includes the step of immersing and brushing said engraved printing plate in a solvent solution for a predetermined time period at a temperature approximating 40.0 degrees Centigrade.

18. The method for laser engraving as recited in claim 13 where said step of removing said release layer includes the step of drying said photopolymer printing plate.

* * * * *